United States Patent
Mori et al.

(10) Patent No.: US 11,978,612 B2
(45) Date of Patent: *May 7, 2024

(54) PLASMA PROCESSING APPARATUS

(71) Applicant: HITACHI HIGH-TECH CORPORATION, Tokyo (JP)

(72) Inventors: Isao Mori, Tokyo (JP); Masaru Izawa, Tokyo (JP); Naoki Yasui, Tokyo (JP); Norihiko Ikeda, Tokyo (JP); Kazuya Yamada, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/861,515

(22) Filed: Jul. 11, 2022

(65) Prior Publication Data

US 2023/0058692 A1 Feb. 23, 2023

Related U.S. Application Data

(62) Division of application No. 16/959,099, filed as application No. PCT/JP2019/030660 on Aug. 5, 2019, now Pat. No. 11,424,105.

(51) Int. Cl.
  *H01J 37/32* (2006.01)
  *H01L 21/3065* (2006.01)
  *H05H 1/46* (2006.01)

(52) U.S. Cl.
  CPC .. *H01J 37/32128* (2013.01); *H01J 37/32183* (2013.01); *H01J 37/32577* (2013.01);
  (Continued)

(58) Field of Classification Search
  None
  See application file for complete search history.

(56) References Cited

U.S. PATENT DOCUMENTS 7,250,091 B2 * 7/2007 Gupta .................. B60N 2/686
  297/452.1
7,869,526 B2 * 1/2011 Maxwell ................ H03K 5/06
  375/259
(Continued)

FOREIGN PATENT DOCUMENTS

JP H08181118 A 7/1996
JP 2010-103465 A 5/2010
(Continued)

OTHER PUBLICATIONS

Search Report dated Sep. 28, 2021 in International Application No. PCT/JP2021/030735.

(Continued)

*Primary Examiner* — Srinivas Sathiraju
(74) *Attorney, Agent, or Firm* — Miles & Stockbridge, P.C.

(57) ABSTRACT

A plasma processing apparatus includes a processing chamber in which a sample is subjected to plasma processing, a first radio frequency power supply that supplies radio frequency power for generating plasma, a sample stage on which the sample is mounted, and a second radio frequency power supply that supplies radio frequency power to the sample stage, the plasma processing apparatus further includes a DC power supply that applies a DC voltage, that is changed according to a periodically repeated waveform, to the sample stage, and the waveform of one cycle has a period in which amplitude changes by a predetermined amount or more during a predetermined time. Accordingly, charged particles on a wafer surface are removed, a trench shape with high verticality can be obtained, and damage to a film that is not to be etched inside a trench can be reduced.

16 Claims, 15 Drawing Sheets

(52) U.S. Cl.
CPC ........... *H01L 21/3065* (2013.01); *H05H 1/46* (2013.01); *H01J 2237/334* (2013.01)

(56) References Cited

U.S. PATENT DOCUMENTS

| | | | |
|---|---|---|---|
| 10,431,428 B2* | 10/2019 | Bhutta | H01L 21/31116 |
| 10,734,196 B2* | 8/2020 | Morii | H05H 1/46 |
| 10,755,897 B2* | 8/2020 | Ikeda | H01L 21/31116 |
| 10,778,209 B1* | 9/2020 | Morii | H03K 17/567 |
| 10,812,071 B2* | 10/2020 | Morii | H03K 17/74 |
| 10,985,735 B2* | 4/2021 | Morii | H03H 11/30 |
| 11,050,400 B2* | 6/2021 | Morii | H03H 7/38 |
| 11,101,109 B2* | 8/2021 | Morii | H01J 37/32183 |
| 11,218,129 B2* | 1/2022 | Morii | H03H 7/40 |
| 11,218,135 B2* | 1/2022 | Morii | H01J 37/32183 |
| 11,309,164 B2* | 4/2022 | Taniguchi | H01J 37/32183 |
| 11,329,614 B2* | 5/2022 | Kotani | H03F 1/565 |
| 11,348,762 B2* | 5/2022 | Morii | H01J 37/32183 |
| 11,387,078 B2* | 7/2022 | Morii | H01J 37/241 |
| 11,525,946 B2* | 12/2022 | Shklover | G02B 27/0006 |
| 11,527,385 B2* | 12/2022 | Maw | H01J 37/32183 |
| 11,531,312 B2* | 12/2022 | Coumou | H01J 37/32926 |
| 11,536,755 B2* | 12/2022 | Fisk, II | H01J 37/32091 |
| 11,545,340 B2* | 1/2023 | An | G01R 23/04 |
| 11,545,342 B2* | 1/2023 | Ni | H01J 37/32146 |
| 11,545,954 B2* | 1/2023 | Morii | H03H 7/38 |
| 11,552,612 B2* | 1/2023 | Morii | H03H 7/38 |
| 11,561,089 B2* | 1/2023 | Yamada | G01B 11/303 |
| 11,569,065 B2* | 1/2023 | Kang | H01L 21/32136 |
| 11,569,066 B2* | 1/2023 | Cubaynes | H02M 7/49 |
| 11,594,400 B2* | 2/2023 | Bise | H01J 37/3244 |
| 11,594,428 B2* | 2/2023 | Tran | H01J 37/32715 |
| 11,596,309 B2* | 3/2023 | Oliveti | H01J 37/32183 |
| 11,605,527 B2* | 3/2023 | De Chambrier | H01J 37/32183 |
| 11,615,941 B2* | 3/2023 | Brouk | H01J 37/32174 |
| | | | 315/111.21 |
| 11,615,942 B2* | 3/2023 | Huang | H01J 37/32091 |
| | | | 216/67 |
| 11,637,002 B2* | 4/2023 | Singh | H01J 37/32522 |
| | | | 156/345.34 |
| 11,651,966 B2* | 5/2023 | Ramaswamy | H01J 37/32568 |
| | | | 438/710 |
| 11,657,980 B1* | 5/2023 | Poghosyan | H01G 5/014 |
| | | | 361/278 |
| 2007/0237208 A1* | 10/2007 | Maxwell | H03K 5/12 |
| | | | 375/130 |
| 2010/0072172 A1* | 3/2010 | Ui | H01J 37/321 |
| | | | 156/345.48 |
| 2012/0052689 A1* | 3/2012 | Tokashiki | H01L 21/31116 |
| | | | 156/345.28 |
| 2012/0247677 A1* | 10/2012 | Himori | H01J 37/32697 |
| | | | 156/345.44 |
| 2013/0106421 A1* | 5/2013 | Dubourg | E21B 47/085 |
| | | | 324/355 |
| 2014/0011365 A1* | 1/2014 | Yasui | H01L 21/3065 |
| | | | 438/712 |
| 2014/0275116 A1* | 9/2014 | Hogan, II | A61K 31/341 |
| | | | 514/255.04 |
| 2015/0126037 A1* | 5/2015 | Chen | H01J 37/32165 |
| | | | 438/711 |
| 2015/0162223 A1 | 6/2015 | Ui et al. | |
| 2016/0240427 A1* | 8/2016 | Lee | H01L 21/02532 |
| 2017/0110296 A1* | 4/2017 | Himori | H01J 37/32091 |
| 2017/0301516 A1* | 10/2017 | Bhutta | H03H 7/38 |
| 2018/0082821 A1* | 3/2018 | Ikeda | H01J 37/32183 |
| 2018/0226227 A1* | 8/2018 | Donnelly | H01J 37/32045 |
| 2019/0088452 A1* | 3/2019 | Yamada | H01J 37/32678 |
| 2019/0108976 A1* | 4/2019 | Van Zyl | H01J 37/32174 |
| 2019/0115193 A1* | 4/2019 | Yasui | H01J 37/32192 |
| 2019/0237300 A1* | 8/2019 | Ikeda | H01J 37/32192 |
| 2020/0144031 A1* | 5/2020 | Tamamushi | H01J 37/32174 |
| 2020/0211823 A1* | 7/2020 | Hisatomi | H01J 37/32146 |
| 2020/0279719 A1* | 9/2020 | Yamada | H01L 21/67069 |
| 2020/0286715 A1* | 9/2020 | Ikeda | H01J 37/32201 |
| 2021/0043424 A1* | 2/2021 | Mori | H05H 1/46 |

FOREIGN PATENT DOCUMENTS

| | | |
|---|---|---|
| JP | 2012054534 A | 3/2012 |
| JP | 2012169542 A | 9/2012 |
| JP | 2012216608 A | 11/2012 |
| JP | 2020-077862 A | 5/2020 |
| JP | 2020-109838 A | 7/2020 |
| KR | 20150123209 A | 11/2015 |
| TW | I591677 B | 7/2017 |

OTHER PUBLICATIONS

Written Opinion dated Sep. 28, 2021 in International Application No. PCT/JP2021/030735.
Search Report dated Sep. 10, 2019, in corresponding International Application No. PCT/JP2019/030660.
Written Opinion dated Sep. 10, 2019, in corresponding International Application No. PCT/JP2019/030660.
Office Action dated May 27, 2021 on Korean Application No. 10-2020-7009882.
Office Action dated Jul. 28, 2021 in U.S. Appl. No. 16/959,099.
Allowance dated Apr. 12, 2022 in U.S. Appl. No. 16/959,099.
Office Action mailed Oct. 6, 2023 in Taiwanese Application No. 111102326.

* cited by examiner

[FIG. 1]
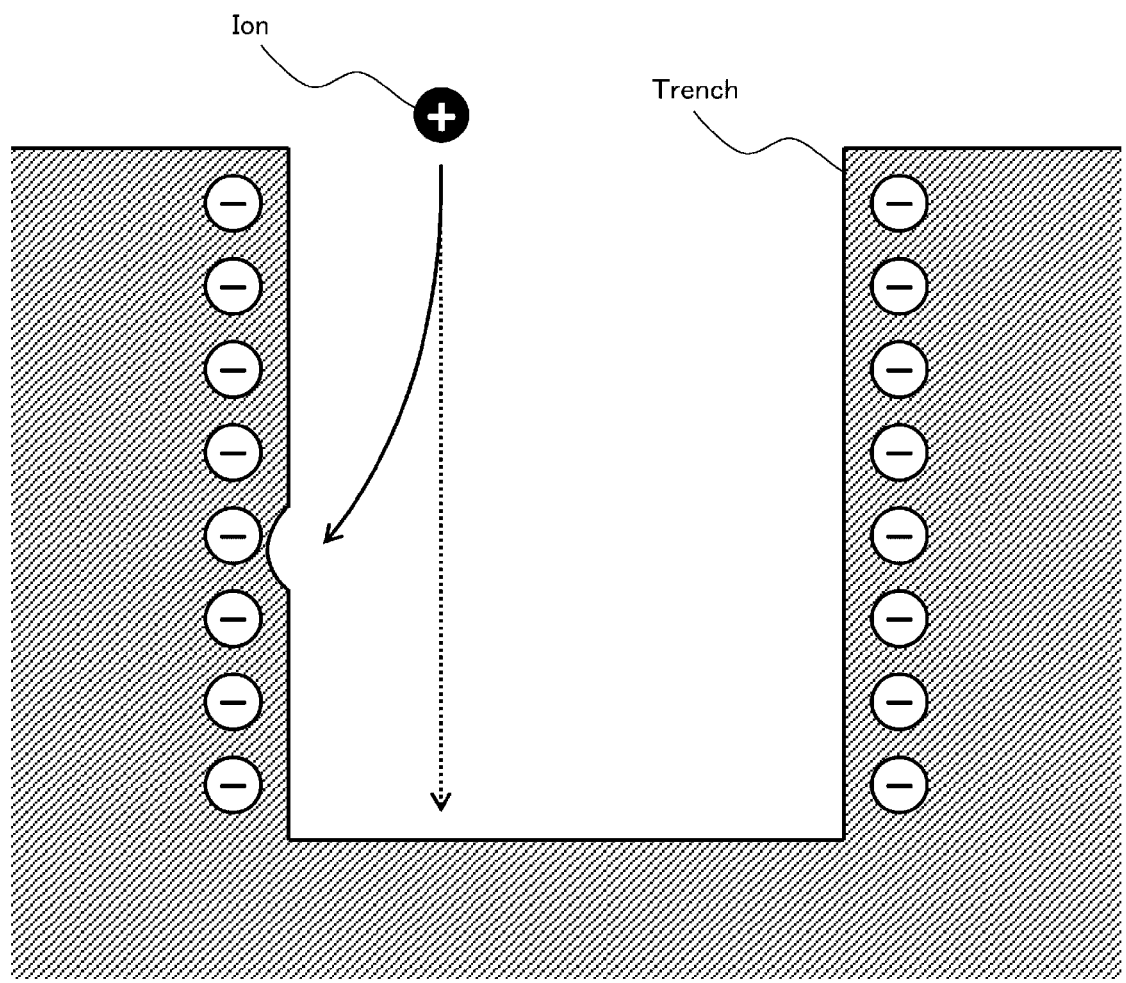

[FIG. 2]
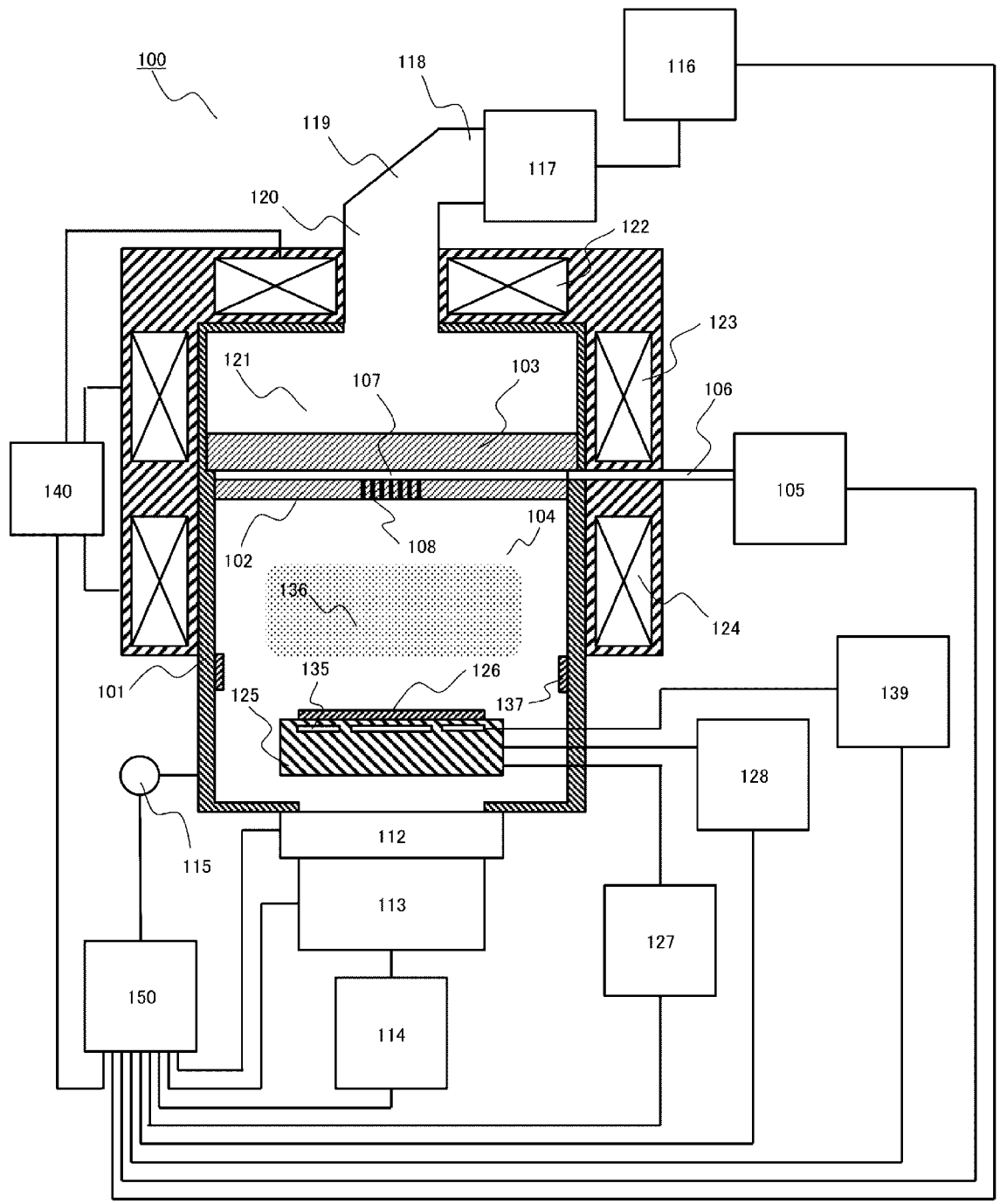

[FIG. 3]
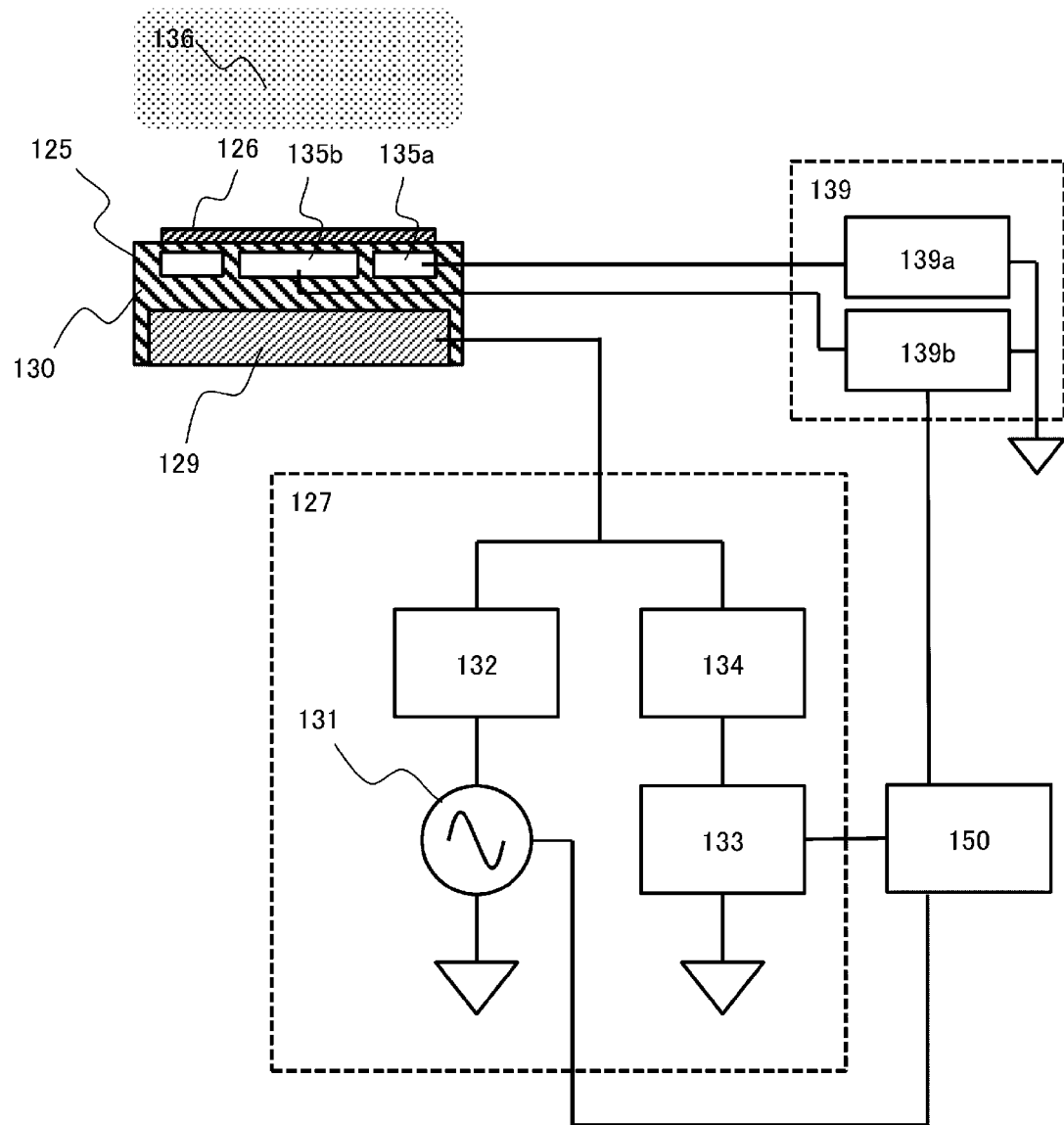

[FIG. 4]
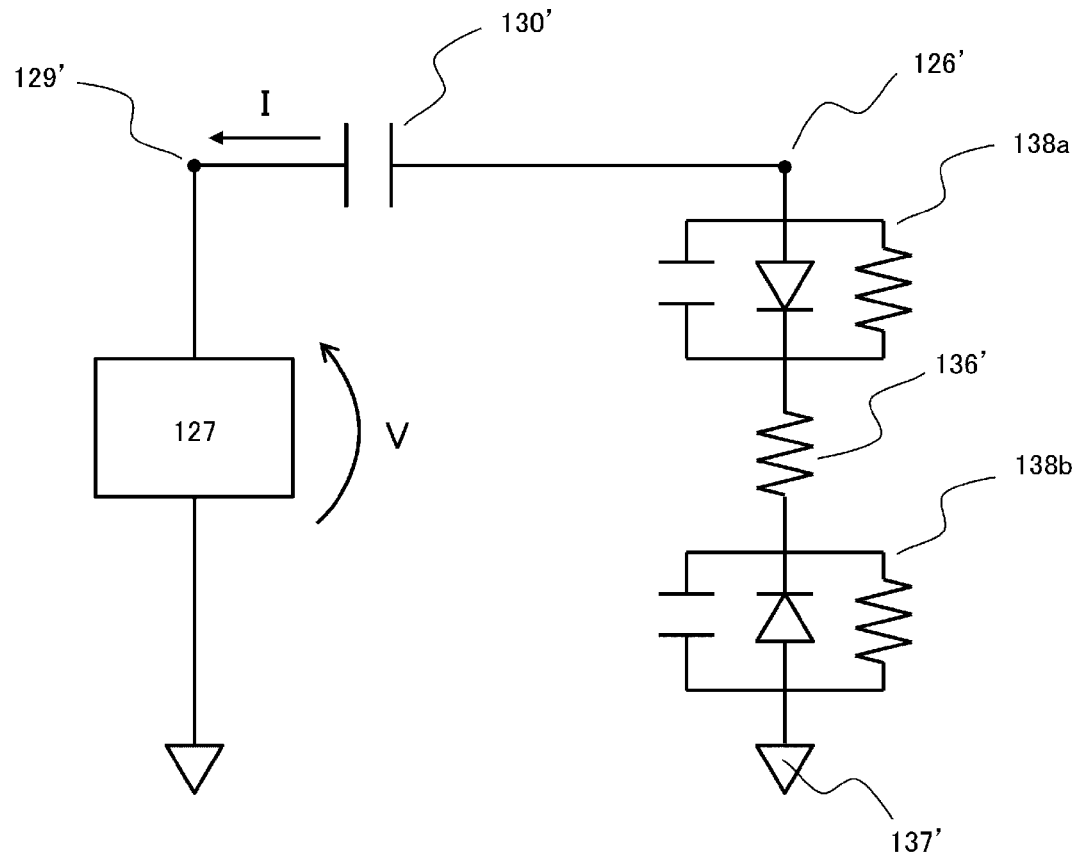
[FIG. 5]
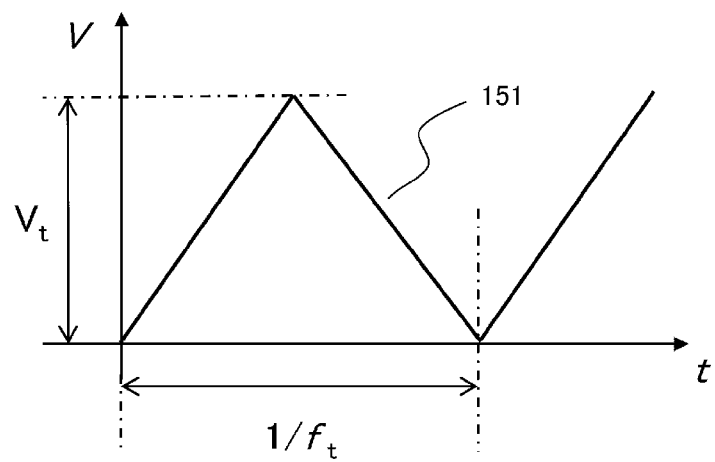

[FIG. 6]
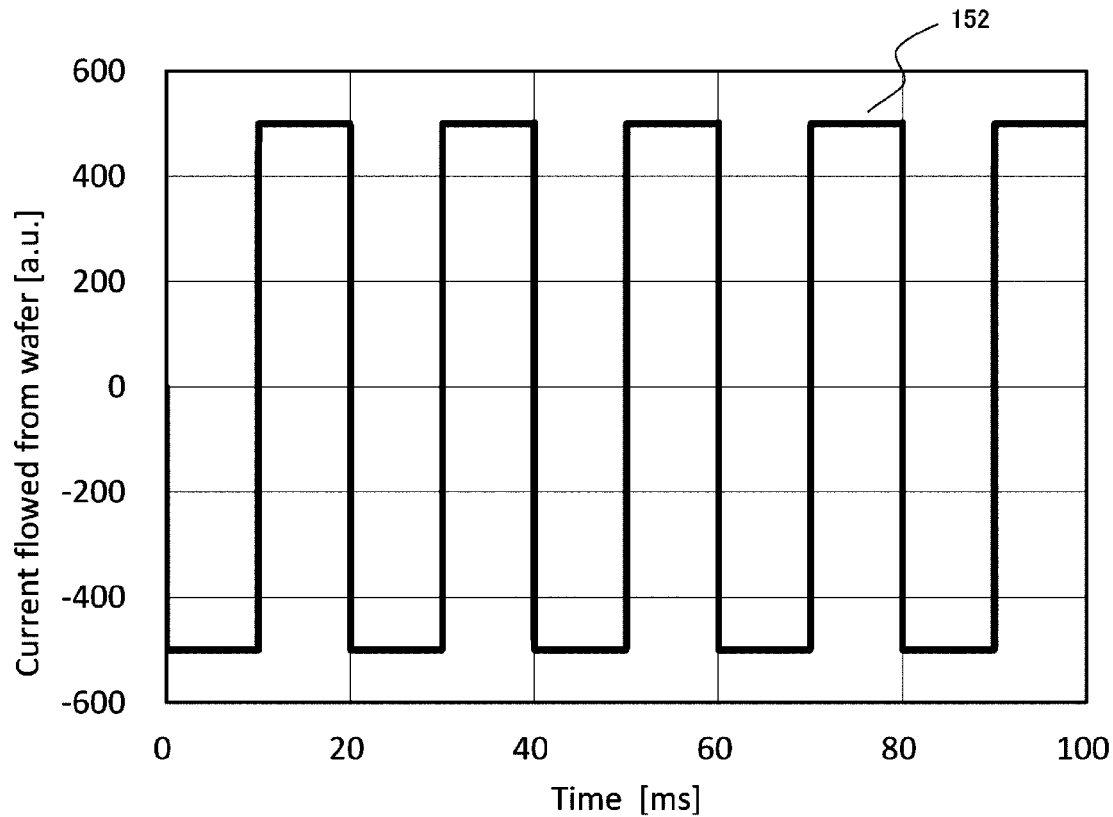
[FIG. 7]
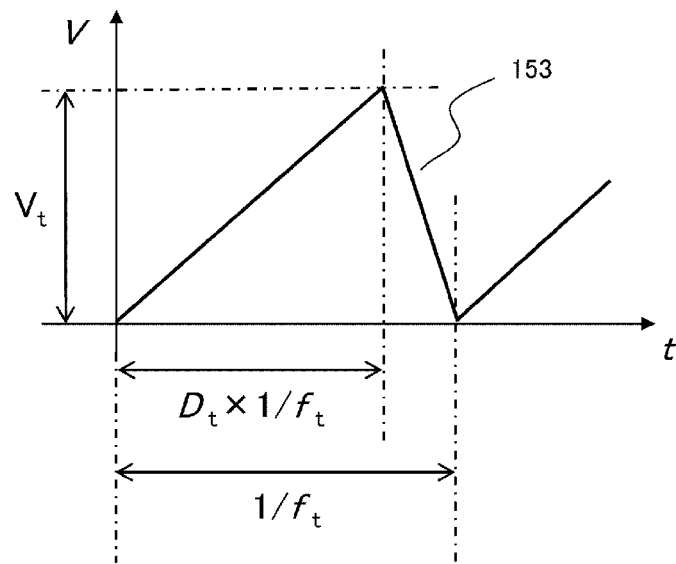

[FIG. 8]
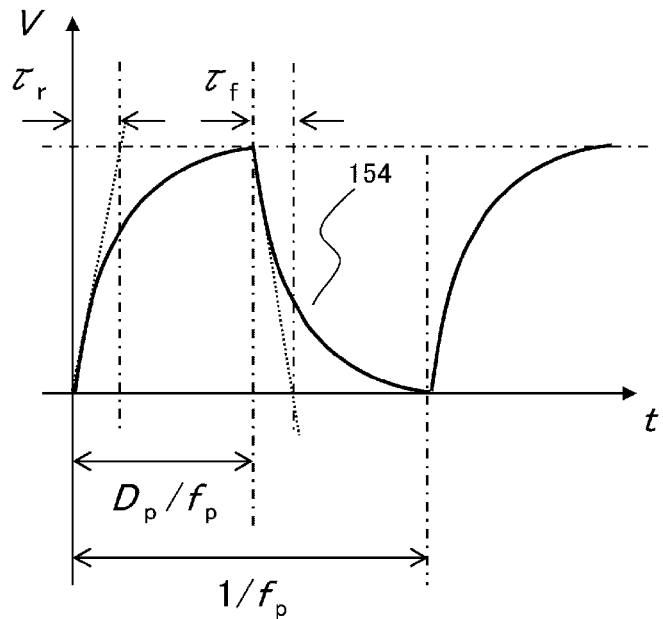
[FIG. 9]
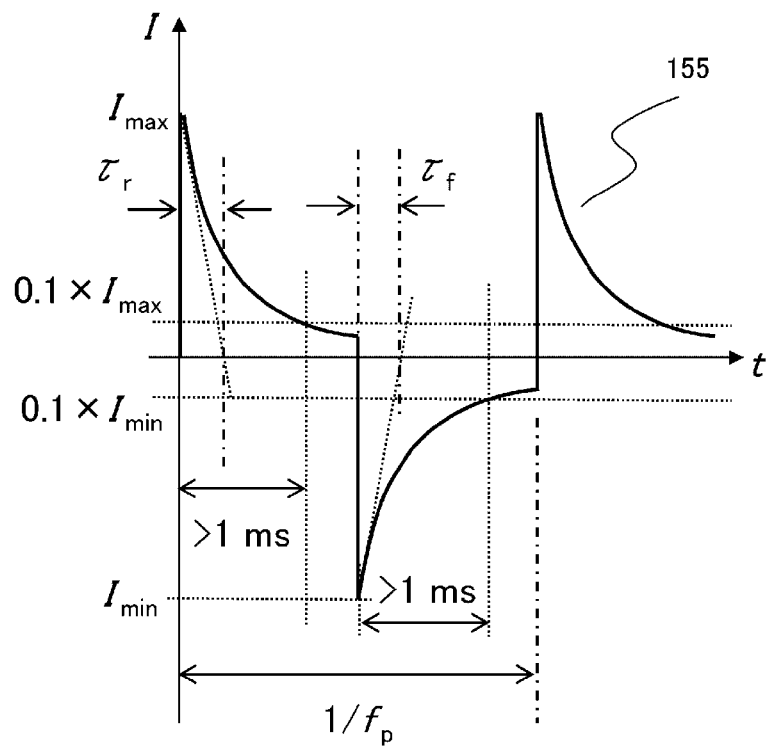

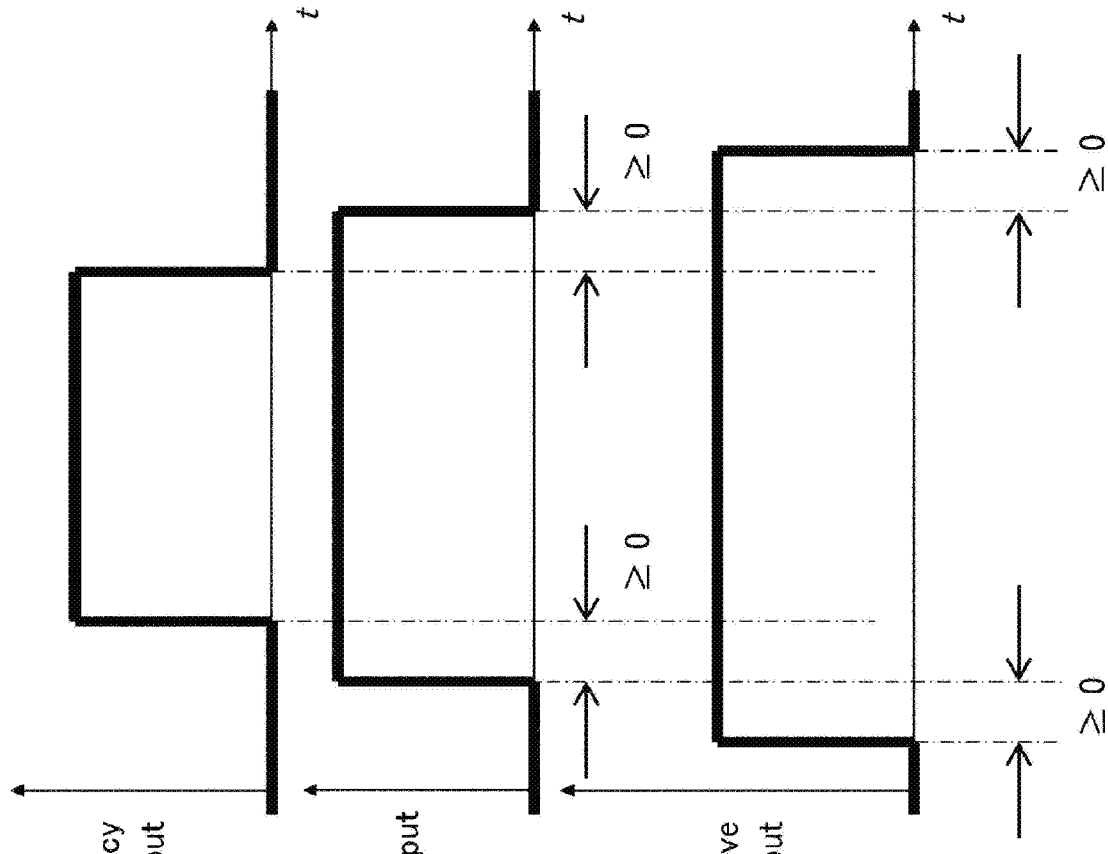

[FIG. 11]
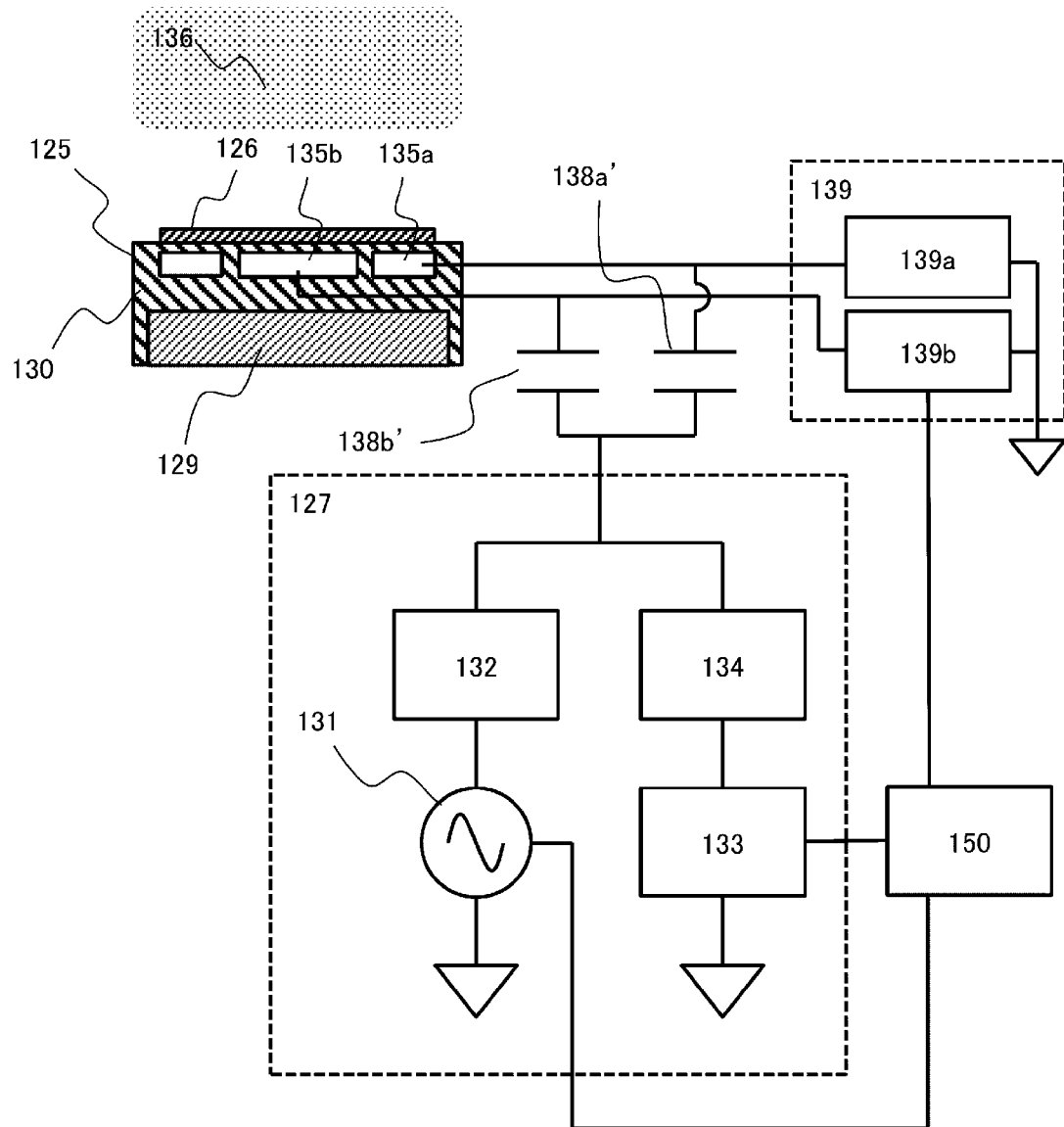

[FIG. 12]
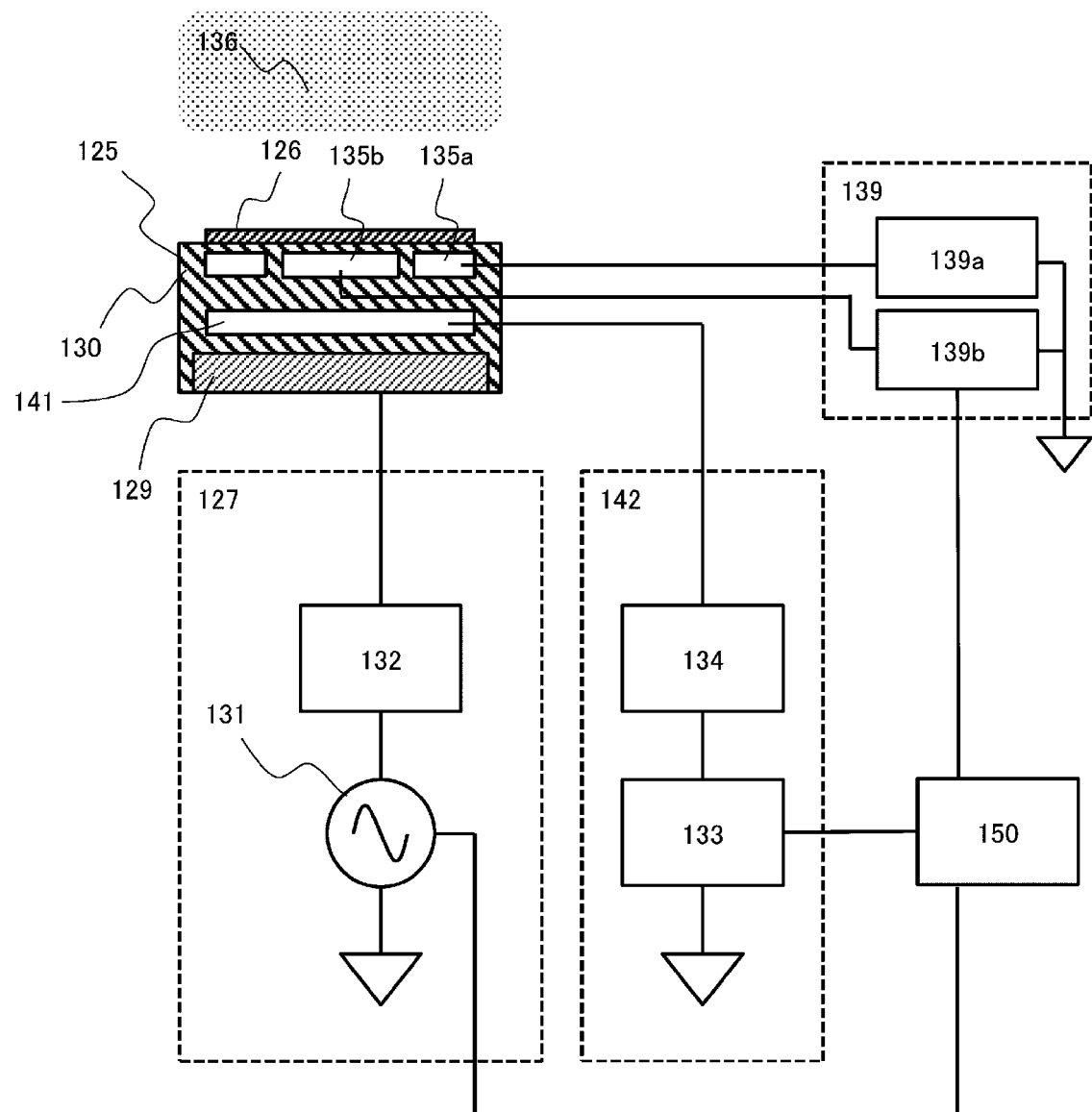

[FIG. 13]
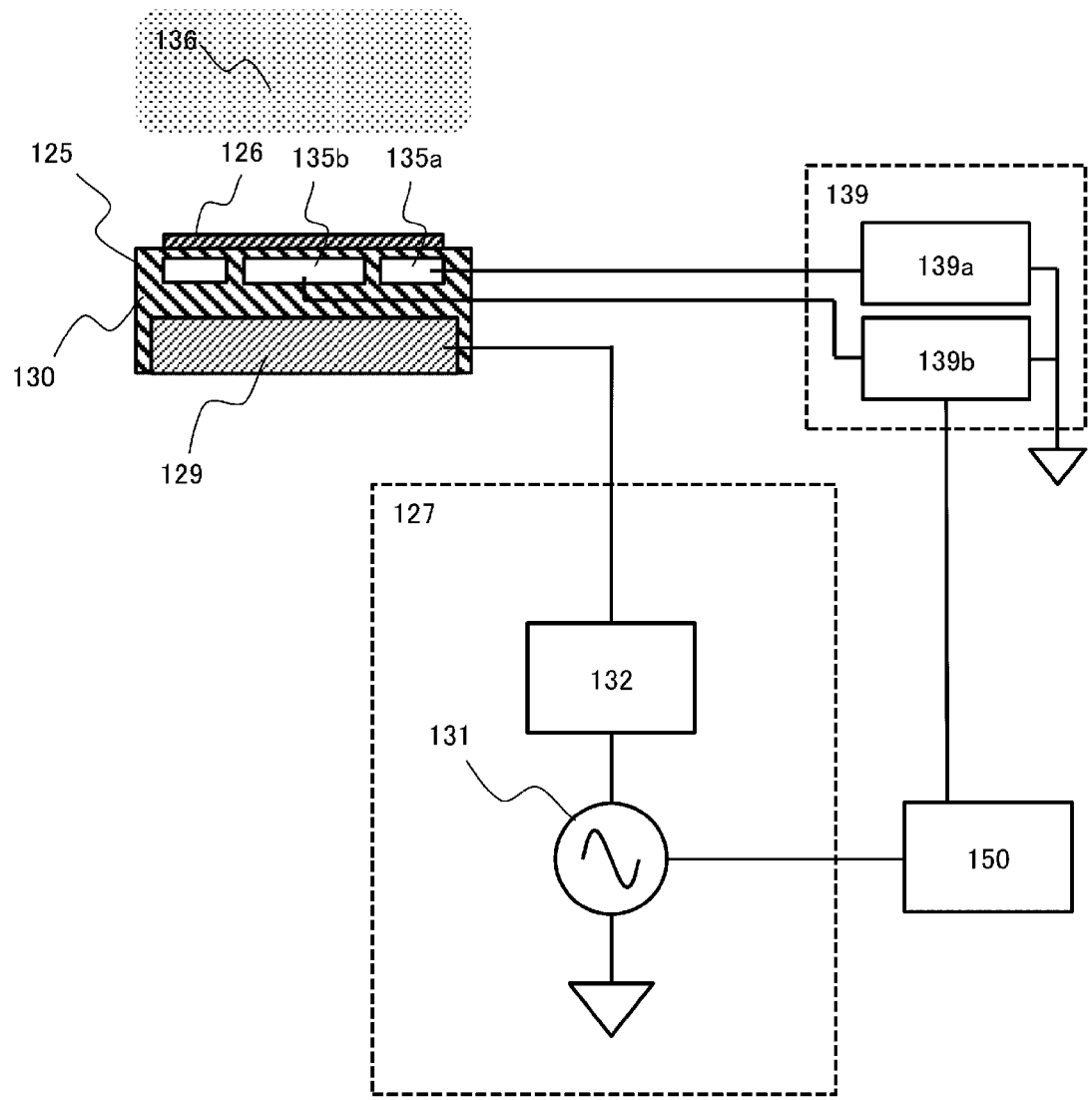

[FIG. 14]
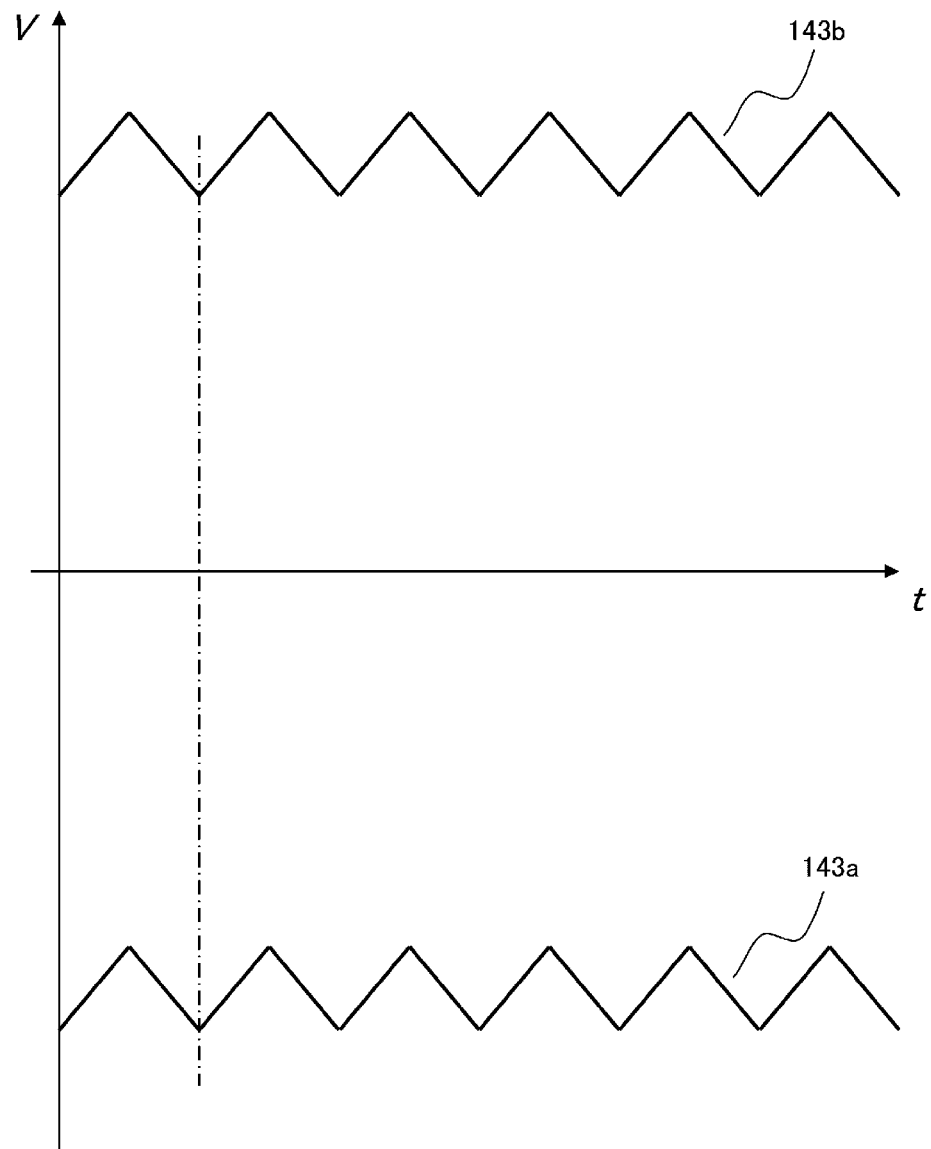

[FIG. 15]
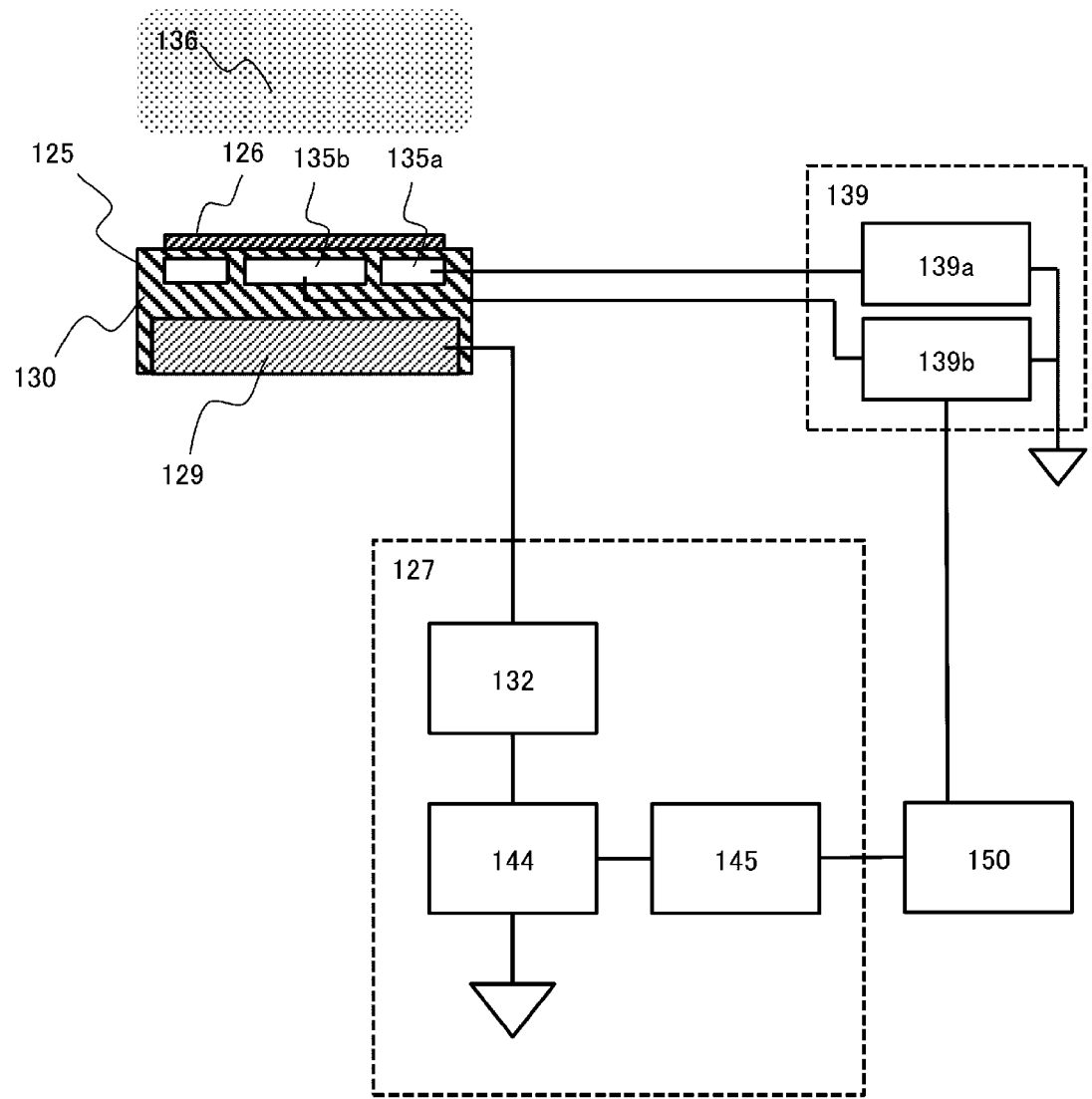

[FIG. 16]
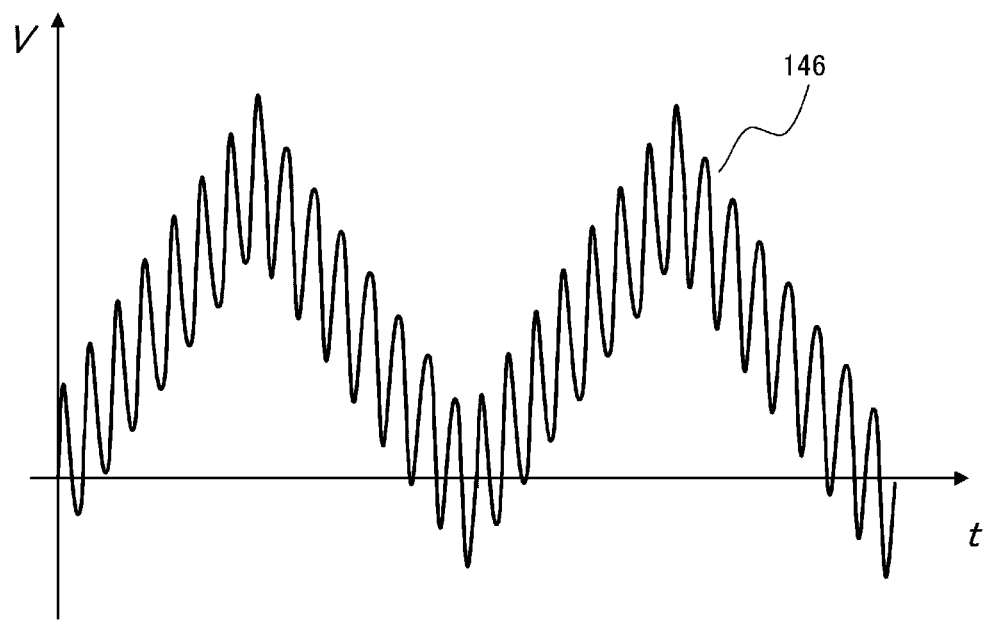

[FIG. 17]
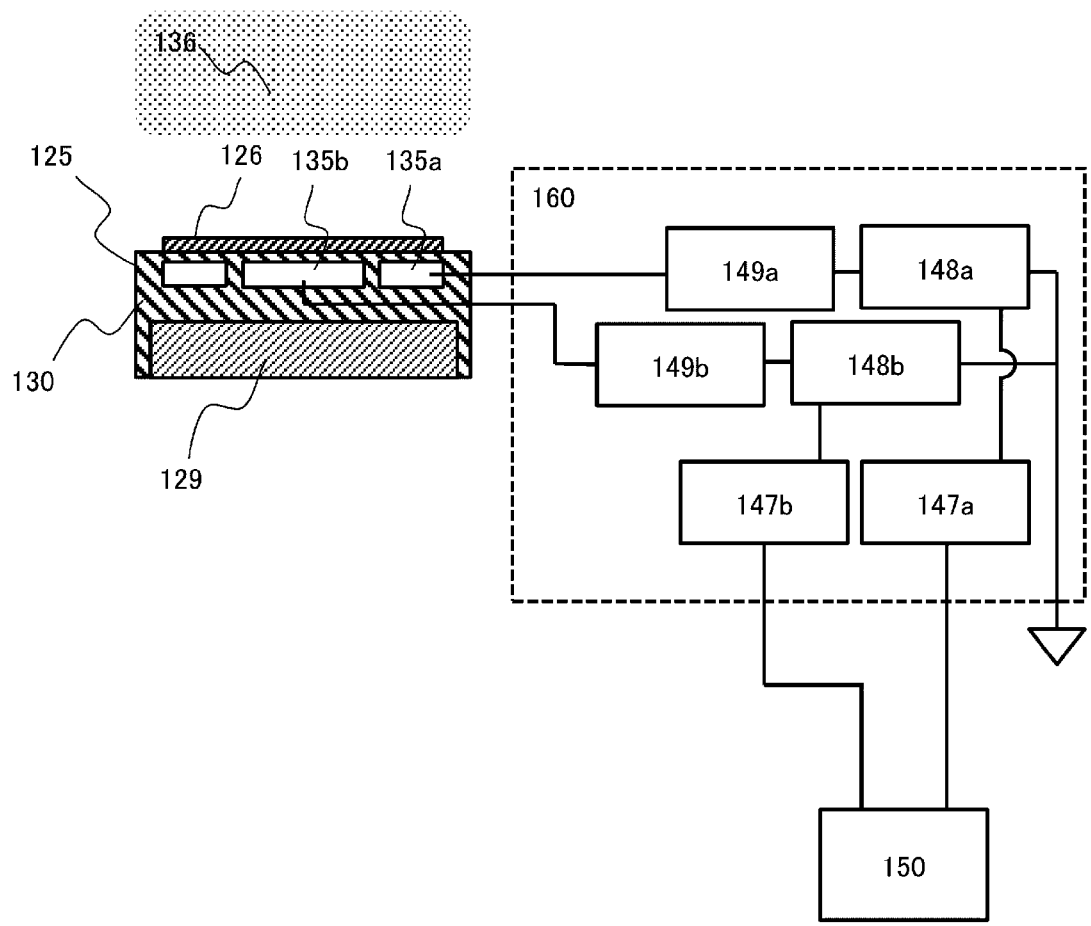

[FIG. 18]
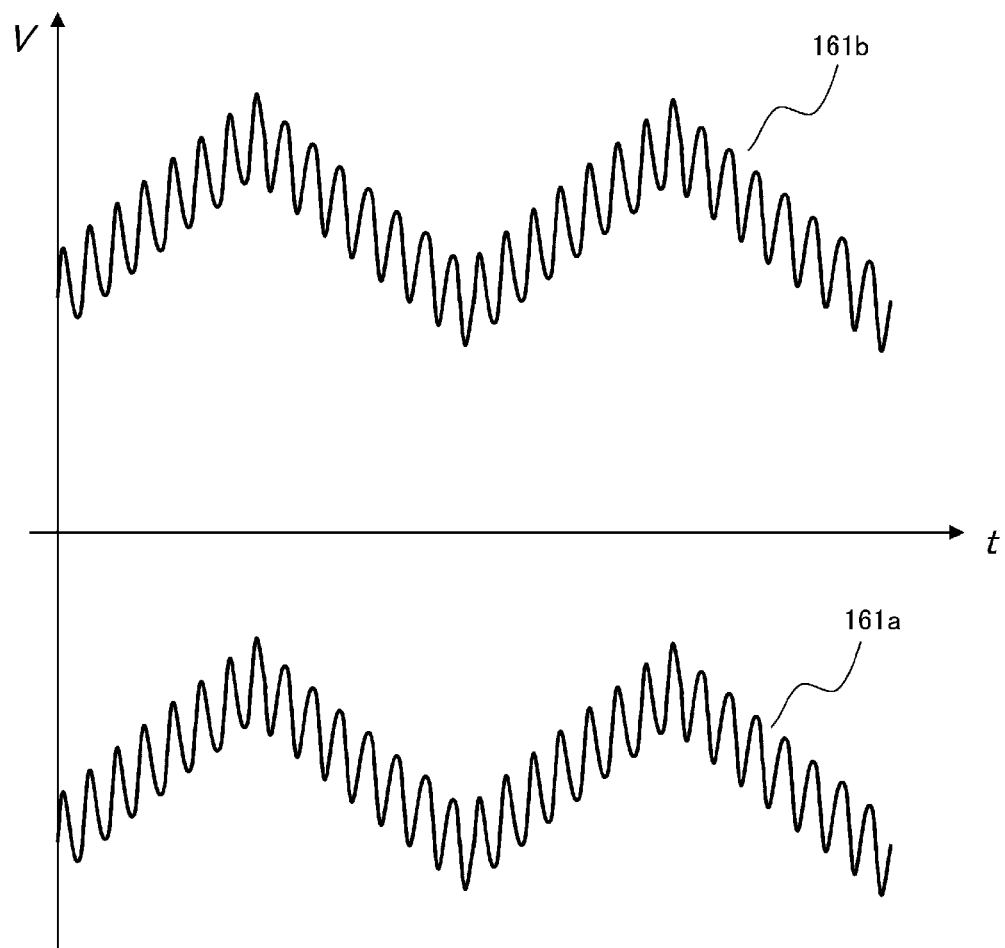

PLASMA PROCESSING APPARATUS

TECHNICAL FIELD

The present invention relates to a plasma processing apparatus.

BACKGROUND ART

In a manufacturing step of a semiconductor device, there is a demand for miniaturization and integration of components included in the semiconductor device. For example, in an integrated circuit or a nano-electromechanical system, nanoscaling of a structure is being further promoted.

Generally, in the manufacturing step of the semiconductor device, a lithography technique is used to form a fine pattern. In this technique, a pattern of a device structure is applied on a resist layer, and a substrate exposed by the pattern of the resist layer is selectively removed by etching. In subsequent processing steps, by depositing another material in an etching region, the integrated circuit can be formed.

Therefore, in the manufacturing of the semiconductor device, a plasma etching processing apparatus is indispensable. In a plasma etching processing, gas supplied to the inside of a processing chamber whose pressure is reduced to a predetermined degree of vacuum is turned into plasma by an electric field or the like formed inside a vacuum vessel. At this time, etching is performed by reacting physically and chemically highly reactive ions or radicals generated in the plasma with a surface of a wafer to be processed.

In the plasma etching processing, it is common to apply a radio frequency voltage to a wafer mounting table. When the radio frequency voltage is applied to a mounting table to which a radio frequency power supply is connected via a capacitor, since a sheath generated between the plasma and the mounting table has a rectifying action, the time-averaged voltage of the mounting table becomes negative due to self-bias. Therefore, positive ions are accelerated, the etching proceeds rapidly, and verticality is increased, so that anisotropic etching can be realized. Then, by adjusting amplitude of the radio frequency voltage applied to the mounting table, it is possible to control an etching rate and the verticality.

Generally, although a sine wave is used as the radio frequency voltage applied to the wafer mounting table, as disclosed in PTL 1, a rectangular wave may also be used instead of the sine wave. Energies of the ions flowing from the plasma to the mounting table are determined by the electric field applied between the plasma and the mounting table. When the radio frequency voltage of the sine wave is applied, since the electric field changes gradually, the ions of various energies flow to the mounting table. However, when the radio frequency voltage of the rectangular wave is applied, since the energies of the ions are clearly divided into high and low energies, an etching control is easier.

CITATION LIST

Patent Literature

PTL 1: JP-A-2012-216608

SUMMARY OF INVENTION

Technical Problem

In the plasma etching processing, a dielectric material formed on the wafer is charged by a collision of charged particles. In the plasma etching processing, a trench shape is often formed on the wafer as shown in FIG. 1, and in this case, it is generally desirable that side walls of a trench is vertical to a wafer surface. However, when the radio frequency voltage is applied to a trench structure, the side walls of the trench may be charged as shown in FIG. 1. This is because the positive ions are incident vertically into the trench by negative self-bias due to the radio frequency voltage, whereas a direction of electrons or negative ions is random, so that more negatively charged particles collide with the side walls. As a result, as shown in FIG. 1, the ions flying into the trench have trajectories bent and collide with the side walls, and the side walls are etched, so that the verticality of the side walls of the trench is deteriorated.

For a convenience of a step, there may be a metal layer that should not be etched in a part of the trench. For example, when the trajectories of the ions are bent in a case where there is such a metal layer, the ions are incident obliquely on the metal layer. Then, the metal layer is more easily sputtered than in a case where the ions are incident vertically, so that damage to the metal layer increases, and a desired etching may not be performed. From the above, removing the charged particles charged on the wafer surface is a problem in performing highly accurate etching processing.

In order to remove the charged particles on the wafer surface, one measure is to generate a continuous current by the charged particles by applying a voltage having a polarity opposite to the charged particles to the wafer and forming an electric field inside the dielectric material formed on the wafer. However, it is known that it takes a time in an order of milliseconds to remove the charged particles from the dielectric material since a moving speed of the charged particles inside the dielectric material is low. On the other hand, the radio frequency voltage as disclosed in PTL 1 is generally used at a frequency of several hundred kHz to several MHz such that the radio frequency voltage can pass through the capacitor between the mounting table and the radio frequency power supply. Therefore, a technique of PTL 1 is not suitable for removing the charged particles.

An object of the invention is to provide a plasma processing apparatus capable of obtaining a trench shape with high verticality and reducing damage to a film that is not to be etched inside a trench by removing charged particles on a wafer surface.

Solution to Problem

In order to solve the above problems, one of typical plasma processing apparatuses according to the invention includes a processing chamber in which a sample is subjected to plasma processing; a first radio frequency power supply that supplies radio frequency power for generating plasma; a sample stage on which the sample is mounted; and a second radio frequency power supply that supplies radio frequency power to the sample stage, the plasma processing apparatus further includes a DC power supply that applies a DC voltage, that is changed according to a periodically repeated waveform, to the sample stage, and the waveform of one cycle has a period in which amplitude changes by a predetermined amount or more during a predetermined time.

Advantageous Effect

According to the invention, it is possible to provide a plasma processing apparatus capable of obtaining a trench shape with high verticality and reducing damage to a film that is not to be etched inside a trench by removing charged particles on a wafer surface.

Problems, configurations, and effects other than those described above will be obvious from descriptions of the following embodiments.

BRIEF DESCRIPTION OF DRAWINGS

FIG. 1 is a schematic diagram showing a trench shape in a plasma etching processing and an ion trajectory when side walls of a trench are charged.

FIG. 2 is a schematic diagram showing an example of a schematic configuration of a plasma processing apparatus according to an embodiment.

FIG. 3 is a cross-sectional view of a part of the plasma processing apparatus according to the embodiment shown in FIG. 2, and is a diagram schematically showing an outline of a bias voltage generator connected to a mounting table.

FIG. 4 is a diagram showing an electrical equivalent circuit of the plasma processing apparatus.

FIG. 5 is a diagram showing a voltage waveform output from a DC power supply according to an embodiment shown in FIG. 4.

FIG. 6 is a diagram showing a waveform of a current calculated by a circuit simulator based on the equivalent circuit of FIG. 4, and is a diagram schematically showing the current generated on a wafer by the voltage of FIG. 5.

FIG. 7 is a diagram showing a voltage waveform of a deformed linear triangular wave.

FIG. 8 is a diagram showing a voltage waveform of a curved triangular wave.

FIG. 9 is a diagram showing a waveform of a current flowing from the wafer.

FIGS. 10A to 10C show a relationship between output start and end time points of a microwave power supply, a radio frequency power supply, and the DC power supply.

FIG. 11 is a cross-sectional view of a part of a plasma processing apparatus according to a first modification of the embodiment shown in FIG. 2, and is a diagram schematically showing an outline of a bias voltage generator connected to the mounting table.

FIG. 12 is a cross-sectional view of a part of a plasma processing apparatus according to a second modification of the embodiment shown in FIG. 2, and is a diagram schematically showing an outline of a bias voltage generator connected to the mounting table.

FIG. 13 is a cross-sectional view of a part of a plasma processing apparatus according to a third modification of the embodiment shown in FIG. 3, and is a diagram schematically showing an outline of a bias voltage generator connected to the mounting table.

FIG. 14 is a diagram showing a voltage waveform output from an electrostatic chuck power supply in the third modification of the embodiment shown in FIG. 2.

FIG. 15 is a cross-sectional view of a part of a plasma processing apparatus according to a fourth modification of the embodiment shown in FIG. 2, and is a diagram schematically showing an outline of a bias voltage generator connected to the mounting table.

FIG. 16 is a diagram showing a voltage waveform output from the bias voltage generator in the fourth modification of the embodiment shown in FIG. 2.

FIG. 17 is a cross-sectional view of a part of a plasma processing apparatus according to a fifth modification of the embodiment shown in FIG. 2, and is a diagram schematically showing an outline of a bias voltage generator connected to the mounting table.

FIG. 18 is a diagram showing a voltage waveform output from an electrostatic chuck power supply in the fifth modification of the embodiment shown in FIG. 2.

DESCRIPTION OF EMBODIMENTS

Hereinafter, embodiments of a plasma processing apparatus according to the invention will be described with reference to the drawings. In the present specification, a "linear triangular wave" of a voltage waveform is a waveform that periodically repeats in a way that rises linearly from a minimum voltage to a maximum voltage and linearly decreases to the minimum voltage immediately after reaching the maximum voltage, and a "curved triangular wave" of the voltage waveform is a waveform that periodically repeats in a way that rises along a curve where a positive differential coefficient monotonically decreases from the minimum voltage to the maximum voltage and decreases along a curve where a negative differential coefficient monotonically increases to the minimum voltage immediately after reaching the maximum voltage.

First Embodiment

The present embodiment will be described with reference to FIGS. 2 to 10C. FIG. 2 is a schematic diagram showing an example of a schematic configuration of a plasma processing apparatus according to the present embodiment.

An example of a plasma processing apparatus 100 according to the present embodiment shown in FIG. 2 is a microwave ECR plasma etching apparatus. Here, an electrode disposed inside a vacuum processing chamber 104, an electric and magnetic field generator disposed outside the vacuum processing chamber 104, a power supply, or the like are schematically illustrated.

The plasma processing apparatus 100 includes the vacuum processing chamber 104. An electrode 125 serving as a sample stage is disposed inside the vacuum processing chamber 104, and a wafer 126 serving as a sample is mounted on the electrode 125. Inside the vacuum processing chamber 104, an electric field and a magnetic field formed by an electric field generating means and a magnetic field generating means disposed outside the vacuum processing chamber 104 act on gas supplied from a gas supply mechanism 105 to the vacuum processing chamber 104, so that plasma 136 is generated. The plasma 136 contains ions and radicals, and these ions and radicals interact with a surface of the wafer 126 to perform plasma etching processing.

In the vacuum processing chamber 104, a shower plate 102 is disposed above a container 101, a dielectric window 103 is further disposed above the container 101, and the container 101 surrounding the vacuum processing chamber 104 is hermetically sealed by the dielectric window 103.

The gas supply mechanism 105 provided outside the vacuum processing chamber 104 is connected to a space 107 provided between the dielectric window 103 and the shower plate 102 through a gas pipe 106. The space 107 communicates with the vacuum processing chamber 104 through a plurality of pores 108 provided in the shower plate 102.

A variable conductance valve 112 is disposed below the vacuum processing chamber 104, and the gas in the vacuum processing chamber 104 is exhausted by a turbo molecular pump 113 connected through the variable conductance valve 112. The turbo molecular pump 113 is further connected to a roughing pump 114. The variable conductance valve 112, the turbo molecular pump 113, and the roughing pump 114 are connected to a control device 150, respectively, and operations are controlled by the control device 150.

More specifically, a pressure gauge 115 that measures an internal pressure of the vacuum processing chamber 104 is provided, and the control device 150 performs feedback control on opening of the variable conductance valve 112 in accordance with a value of the pressure gauge 115 to control a pressure of the vacuum processing chamber 104 to a desired value.

A microwave power supply 116 serving as a first radio frequency power supply is provided in the upper part of the plasma processing apparatus 100, and a frequency of the microwave power supply 116 is, for example, 2.45 GHz. A microwave generated from the microwave power supply 116 propagates to a cavity resonator 121 through an automatic matching device 117, a square waveguide 118, a square circular waveguide converter 119, and a circular waveguide 120. The automatic matching device 117 has a function of automatically preventing a reflected wave, and the cavity resonator 121 has a function of adjusting a microwave electromagnetic field distribution suitable for plasma processing. The microwave power supply 116 is controlled by the control device 150.

The vacuum processing chamber 104 is provided below the cavity resonator 121 with the dielectric window 103 serving as a microwave introduction window and the shower plate 102 interposed therebetween. A microwave whose distribution is adjusted by the cavity resonator 121 propagates through the dielectric window 103 and the shower plate 102 to the vacuum processing chamber 104.

Solenoid coils 122, 123, and 124 constituting an electromagnet are disposed around the vacuum processing chamber 104 and the cavity resonator 121. The magnetic field is formed inside the vacuum processing chamber 104 by supplying a current to each of the solenoid coils 122, 123, and 124 by a coil power supply 140 controlled by the control device 150.

As described above, when a radio frequency electric field and a radio frequency magnetic field are formed inside the vacuum processing chamber 104, the plasma is formed by Electron Cyclotron Resonance (ECR) to be described later in a region where strengths of the electric field and the magnetic field have a specific relationship (for example, a region where a strength of the magnetic field is 0.0875 T when the electric field is 2.45 GHz).

Hereinafter, the ECR will be described in detail. Electrons existing inside the vacuum processing chamber 104 move by a Lorentz force while rotating along a line of a magnetic force of the magnetic field generated by the solenoid coils 122, 123, and 124. At this time, when the frequency of the microwave propagated from the microwave power supply 116 matches a frequency of the rotation, the electrons are resonantly accelerated, and the plasma is effectively generated, which is referred to as the ECR.

A region where the ECR occurs (ECR surface) can be controlled by a magnetic field distribution. Specifically, by controlling the current flowing through each of the solenoid coils 122, 123, 124 via the coil power supply 140 by the control device 150, the magnetic field distribution inside the vacuum processing chamber 104 is controlled, and a plasma generation region inside the vacuum processing chamber 104 can be controlled. Further, since the charged particles in the plasma is prevented from spreading to a direction vertical to the line of the magnetic force, it is possible to control spreading of the plasma by controlling the magnetic field distribution and reduce a loss of the plasma. By these effects, a distribution of the plasma above the wafer 126 can be controlled, and the plasma processing can be performed more uniformly.

The electrode 125 is located below the ECR surface, and is fixed to the vacuum processing chamber 104 by a beam (not shown). The electrode 125 and the vacuum processing chamber 104 are substantially cylindrical, and a center axis of each cylinder is the same. The plasma processing apparatus 100 is provided with a transfer device (not shown) such as a robot arm, and the wafer 126 to be processed is transferred to an upper portion of the electrode 125 by the transfer device. The wafer 126 is held on the electrode 125 due to electrostatic chuck of electrostatic chuck electrodes 135 formed inside the electrode 125.

A bias voltage generator 127 is connected to the electrode 125, and a bias voltage is applied to the wafer 126 through the bias voltage generator 127. An amount of the ions in the plasma 136 drawn toward the wafer 126 depends on the bias voltage. Therefore, by controlling the bias voltage generator 127 by the control device 150 to adjust the bias voltage generated on the wafer 126, a plasma processing shape (a distribution of an etching shape) can be controlled.

A temperature control mechanism 128 is mounted on the electrode 125, and the plasma processing shape can be controlled by controlling a temperature of the wafer 126 through the electrode 125.

All of the above configurations are connected to a control computer serving as the control device 150, and a timing and an operation amount thereof are controlled so as to operate in an appropriate sequence. Detailed parameters of an operation sequence are called recipes, and a control is performed based on preset recipes.

The recipes usually include a plurality of steps. Processing conditions such as a gas type and gas flow supplied from the gas supply mechanism 105 to the vacuum processing chamber 104, an output power of the microwave power supply 116, an amount of the current flowing through the solenoid coils 122, 123 and 124, and a mode of the bias voltage generated by the bias voltage generator 127 are set for each step, and each step is executed in a preset order and time.

FIG. 3 is a schematic diagram showing a cross section of the electrode 125 and details of the bias voltage generator 127 according to the embodiment shown in FIG. 2.

The electrode 125 includes a base material 129 of a conductor and a dielectric film 130, and the bias voltage generator 127 is connected to the base material 129. The electrode 125 includes electrostatic chuck electrodes 135*a* and 135*b* between the wafer 126 and the base material 129, respectively, and the electrostatic chuck electrodes 135*a* and 135*b* are insulated from surroundings by the dielectric film 130.

The electrostatic chuck electrode 135*a* is annularly disposed on an outer periphery portion of the electrode, and the electrostatic chuck electrode 135*b* is disposed on an inner side of the electrostatic chuck electrode 135*a* and at a center of the electrode. An electrostatic chuck power supply 139 includes power supply units 139*a* and 139*b*. The power supply unit 139*a* is connected to the electrostatic chuck electrode 135*a*, and the power supply unit 139*b* is connected to the electrostatic chuck electrode 135*b*, respectively. By outputting the voltage independently from each of the power supply units 139*a* and 139*b*, a force that attracts the wafer 126 to the electrode 125 is generated.

The bias voltage generator 127 includes a radio frequency power supply (a second radio frequency power supply) 131, an automatic matching device 132, a DC power supply 133 that outputs a DC voltage changed according to a periodically repeated waveform, and a low-pass filter 134. The radio frequency power supply 131 is connected to the base material 129 via the automatic matching unit 132, and the DC power supply 133 is connected to the base material 129 via the low-pass filter 134. The radio frequency power supply 131 and the DC power supply 133 are connected to the control device (a control mechanism) 150, respectively, and the operation is controlled in accordance with signals from the control device 150.

An output frequency of the radio frequency power supply 131 is lower than that of the microwave power supply 116 and high enough to transmit the bias voltage to the wafer 126 via the dielectric film 130. Specifically, several hundred kHz to several MHz are used as the output frequency of the radio frequency power supply 131. The automatic matching device 132 performs impedance matching by changing a circuit constant of an internal element in accordance with an impedance of the plasma 136, so that the radio frequency power supply 131 can efficiently transmit a power to the wafer 126.

FIG. 4 shows an electrical equivalent circuit of the plasma processing apparatus 100. An output from the bias voltage generator 127 passes through a point 129' corresponding to the base material 129, and is transmitted to a ground 137' through a capacitor 130' corresponding to the dielectric film 130, a point 126' corresponding to the wafer 126, a parallel circuit 138a corresponding to a sheath between the wafer 126 and the plasma 136, a resistor 136' corresponding to the plasma 136, and a parallel circuit 138b corresponding to a sheath between the plasma 136 and the ground 137' corresponding to a ground 137 in FIG. 2. In this equivalent circuit, a relationship of I=A·dV/dt is approximately established between a voltage V generated by the bias voltage generator 127 and a current I flowing from the wafer 126 using a proportionality constant A.

FIG. 5 is a diagram showing a voltage waveform output from the DC power supply 133. The DC power supply 133 outputs a voltage that changes according to a linear triangular wave 151 having a frequency $f_t$ and amplitude $V_t$ according to a command from the control device 150. That is, in the voltage waveform output from the DC power supply 133, a waveform of one cycle has a period in which the amplitude changes by a predetermined amount or more during a predetermined time. Here, since the current I flowing from the wafer is proportional to a derivative of the voltage of the bias voltage generator 127, a current with a shape of a rectangular wave that is a derivative of the linear triangular wave flows from the wafer.

As in the related art, in a rectangular wave having a sharp rising and falling voltage, a continuation of the current I flowing from the wafer which is proportional to a differential value of the voltage is instantaneously ended. On the other hand, in a case of the linear triangular wave, the current I continuously flows while the voltage is rising or falling. In order to remove electric charges from the wafer, a duration of the current I is at least 1 ms or more, and the longer the duration is, the more preferable. Therefore, a use of the linear triangular wave improves an effect of removing the electric charges from the wafer surface than a use of the rectangular wave having a short duration of the current I. The similar effect is obtained with the curved triangular wave to be described later.

In particular, regarding a falling, when etching results were compared between the rectangular wave having the sharp falling and the curved triangular wave to be described later, the curved triangular wave reduced damage to a metal layer that was not to be etched, and the duration of the current I in falling is important.

A waveform 152 in FIG. 6 was obtained by calculating the current I with a circuit simulator based on the equivalent circuit in FIG. 4. In a simulation, a calculation was performed with $f_t$=50 Hz. According to a result of the simulation, it can be seen that the current I changes in a rectangular wave shape, and flows continuously for $1/(2f_t)$=10 ms at each polarity while the polarity is alternately switched between positive and negative.

In order to move the charged particles accumulated inside the dielectric on the wafer to the outside of the dielectric, a time in an order of milliseconds is required, and when a positive or negative current flowing from the wafer only continues for less than 1 ms, respectively, it only repeats that the charged particles are attracted and returned inside the dielectric. Therefore, $f_t$ is required to be approximately 500 Hz or less. If this condition is satisfied, each of positive and negative currents continues for 1 ms or more, which effectively acts on removing of the charged particles.

It is also conceivable that mobility in the wafer differs between positive electric charges and negative electric charges. Mobility μ is a value represented by p=v/E, wherein v is an average moving speed of the charged particles when an electric field E is applied.

Therefore, in order to make a current flow from the wafer as much as possible while both electric charges are reliably removed regardless of the mobility, a voltage that changes according to a deformed linear triangular wave 153 as shown in FIG. 7 may be output from the DC power supply 133. In this waveform, a ratio of a time during which the voltage rises from the minimum value to the maximum value to a time during which the voltage falls from the maximum value to the minimum value is $D_t:(1-D_t)$.

Here, $D_t$ is represented by $D_t = \mu_i/(\mu_e+\mu_i)$, wherein $\mu_e$ and $\mu_i$ are mobility of the electrons and the ions inside the dielectric on the wafer, respectively. In other words, $D_t$ is a value obtained by dividing the mobility of the ions by a sum of the mobility of the electrons in the dielectric on the wafer and the mobility of the ions in the dielectric. At this time, the ratio of the time during which the voltage rises to the time during which the voltage falls in the linear triangular wave 153 is $(1/\mu p_e):(1/\mu_i)$, which is a ratio of a time required to move the negative electric charges to a time required to move the positive electric charges. On the other hand, in order to secure a time of each polarity for 1 ms or more, a frequency $f_p$ needs to be determined so as to satisfy both $f_p \leq 1000 D_t$ and $f_p \, 1000(1-D_t)$, where a unit of $f_p$ is Hz. The frequency $f_p$ of the triangular wave is preferably 1000 times the smaller value of a value obtained by subtracting $D_t$ from 1 and $D_t$ where the unit of the frequency $f_p$ is Hz.

According to the present embodiment, separately from a radio frequency bias voltage applied to the mounting table, the linear triangular wave output from the DC power supply is superimposed, and thus a current is generated that continues for a sufficient time to remove the charged particles on the wafer surface. According to the current, the charged particles on a sample surface are removed, a trench shape with high verticality can be obtained, and damage to a film that is not to be etched inside a trench can be reduced.

Further, the similar effect can also be obtained by applying a voltage of a curved triangular wave 154 as shown in FIG. 8 instead of the linear triangular wave 151. The curved triangular wave 154 can be said to be a rectangular wave having a large time constant, but has characteristics similar to the linear triangular wave. When the curved triangular wave 154 is formed from the rectangular wave having a large time constant, in a case where a duty ratio is 50%, it is desirable that a rising time constant $\tau_r$ and a falling time constant $\tau_f$ are each set to 0.43 ms or more, typically about several ms. In addition, since each current is required to continue for 1 ms or more, the frequency $f_p$ of the curved triangular wave 154 needs to be 500 Hz or less.

If these conditions are satisfied, as shown in FIG. 9, a current 155 flowing from the wafer is maintained at 10% or more of the maximum value and continues for 1 ms or more from a start of the voltage rising and falling, so that the current can contribute to removing the charged particles. In other words, the change time and the change amount of the amplitude of the voltage waveform output from the DC power supply are preferably such a change time and a change amount of the amplitude that is maintained at 10% or more of the maximum value of the current generated in the wafer by the voltage waveform for 1 ms or more.

Further, a duty ratio $D_p$ of the curved triangular wave 154 may be other than 50% in consideration of a difference between the mobility $\mu_e$ and $\mu_i$ of the electrons and the ions inside the dielectric on the wafer. In this case, $D_p$ is represented by $D_p=\mu_i/(\mu_e+\mu_i)$ as long as $D_p:(1-D_p)=(1/\mu_e):(1/\mu_i)$ is satisfied. In other words, $D_p$ is the value obtained by dividing the mobility of the ions by the sum of the mobility of the electrons in the dielectric on the wafer and the mobility of the ions in the dielectric. At the same time, in order to secure the time of each polarity for 1 ms or more, the frequency $f_p$ needs to be determined so as to satisfy both $f_p \leq 1000 D_t$ and $f_p \leq 1000(1-D_t)$, where the unit of $f_p$ is Hz. The frequency $f_p$ of the triangular wave is preferably 1000 times the smaller value of a value obtained by subtracting $D_p$ from 1 and $D_p$ where the unit of frequency $f_p$ is Hz.

When the curved triangular wave is used instead of the linear triangular wave, a control of the DC power supply 133 is as easy as in a case of using the rectangular wave. When the curved triangular wave is used, a control signal output from the control device 150 may be switched between two types of states, ON and OFF, alternately, and the time constants $\tau_r$ and $\tau_f$ can be realized by means such as applying a low-pass filter to the control signal or an output of the DC power supply 133, or providing output feedback to the DC power supply 133.

In FIGS. 5, 7, and 8, although the waveforms 151, 153, and 154 are shown such that the voltage is always positive, actually, the waveforms may be such that the voltage is always negative, or crosses both positive and negative. This is because whether the voltage is positive or negative has no effect since the current flowing from the wafer is the derivative of the voltage.

FIGS. 10A to 10C show a relationship between output start and end time points of FIG. 10A the radio frequency power supply 131, FIG. 10B the microwave power supply 116, and FIG. 10C the DC power supply 133, with the output on a vertical axis and the time on a horizontal axis. It is desirable that an output of the microwave power supply 116 starts before an output of the radio frequency power supply 131 starts. This is because that the output of the radio frequency power supply 131 is more stable when the output of the radio frequency power supply 131 is started after the plasma is generated by the output of the microwave power supply 116 since an impedance of a chamber referred to the radio frequency power supply 131 greatly differs depending on a presence or an absence of the plasma. For the similar reason, it is desirable that the output of the radio frequency power supply 131 ends before the output of the microwave power supply 116 ends.

It is desirable that the output of the DC power supply 133 starts before the output of the radio frequency power supply 131 starts. The reason is as follows. When radio frequency power is output from the radio frequency power supply 131, since the voltage between the plasma 136 and the wafer 126 increases, verticality of the charged particles drawn into the wafer 126 increases, and side walls of the trench on the wafer 126 are easily charged. On the other hand, the output of the DC power supply 133 has no adverse effect on an apparatus and the etching result. Therefore, it is possible to more effectively prevent charging of the side walls of the trench by setting the output of the DC power supply 133 before the output of the radio frequency power supply 131. For the similar reason, it is desirable that the output of the DC power supply 133 ends after the output of the radio frequency power supply 131 ends.

Further, when the plasma is generated by the microwave power supply 116, a potential difference is generated between the plasma 136 and the wafer 126, so that the charged particles have the verticality, though to a lesser extent than a case where the radio frequency power supply 131 starts outputting. On the other hand, the output of the DC power supply 133 before the output of the microwave power supply 116 has no adverse effect. Therefore, it is desirable that a relationship between output timings of the DC power supply 133 and the microwave power supply 116 is similar with a relationship between output timings of the DC power supply 133 and the radio frequency power supply 131 described above. That is, it is desirable that the output of the microwave power supply 116 starts after the output of the DC power supply 133 starts, and that the output of the microwave power supply 116 ends before the output of the DC power supply 133 ends.

On the other hand, regarding a relationship between output timings of the DC power supply 133 and the electrostatic chuck power supply 139, whichever is started or ended first, there is no particular problem since there is no adverse effect on the apparatus and an etching.

First Modification

A first modification of the embodiment of the invention will be described with reference to FIG. 11. Configurations denoted by reference numerals the same as those shown in FIGS. 2 to 4 described above are portions having the same functions, so that a redundant description of the configurations will be omitted.

FIG. 11 is a schematic diagram showing the cross section of the electrode 125 and details of the bias voltage generator 127 and the electrostatic chuck power supply 139 according to the present modification. In the present modification, the bias voltage generator 127 is connected in parallel with the electrostatic chuck electrodes 135a and 135b, respectively, via capacitors 138a' and 138b'. By connecting via the capacitors 138a' and 138b', the bias voltage generator 127 is not affected by the DC voltage due to the electrostatic chuck power supply 139. Further, by adjusting capacitances of the capacitors 138a' and 138b', capacitances between the base material 129 and the electrostatic chuck electrodes 135a and 135b in the above embodiment can be simulated, and the same effect can be obtained for the wafer in this embodiment and the present modification. A description of a configuration that is the same as the configuration of FIG. 3 according to the embodiment described above will be omitted.

Second Modification

A second modification of the embodiment of the invention will be described with reference to FIG. 12. FIG. 12 is a schematic diagram showing a cross section of the electrode 125 and details of the bias voltage generator 127, the electrostatic chuck power supply 139 and a triangular wave generator 142 according to the present modification. In the present modification, a triangular wave applying electrode 141 is disposed between the electrostatic chuck electrodes 135a and 135b and the base material 129. The electrodes are insulated from the surroundings by the dielectric film 130 and are connected to the DC power supply 133 via the low-pass filter 134. The base material 129 is connected to the radio frequency power supply 131 via the automatic matching device 132. The description of the configuration that is the same as the configuration of FIG. 3 according to the embodiment described above will be omitted.

It is desirable that a thickness of the dielectric film 130 between the triangular wave applying electrode 141 and the electrostatic chuck electrodes 135a and 135b is equal to a thickness of the dielectric film 130 between the base material 129 and the electrostatic chuck electrodes 135a and 135b in the embodiment described above. Accordingly, a capacitance between an application portion of the triangular wave and the electrostatic chuck electrodes 135a and 135b is equal in the present modification and this embodiment, and in the present modification, the similar effect with that of this embodiment can be obtained for the wafer.

Third Modification

A third modification of the embodiment of the invention will be described with reference to FIGS. 13 and 14. FIG. 13 is a schematic diagram showing the cross section of the electrode 125 and details of the bias voltage generator 127 and the electrostatic chuck power supply 139 according to the present modification. In the present modification, the bias voltage generator 127 is connected to the base material 129, and the electrostatic chuck power supply 139 is connected to the electrostatic chuck electrodes 135a and 135b, respectively. The bias voltage generator 127 and the electrostatic chuck power supply 139 are controlled by the control device 150.

Here, the bias voltage generator 127 may be connected to the electrostatic chuck electrodes 135a and 135b via capacitors instead of being connected to the base material 129.

FIG. 14 is a diagram showing waveforms of voltages output from the electrostatic chuck power supply 139, in which a waveform 143a shows an output of the electrostatic chuck power supply 139a, and a waveform 143b shows an output of the electrostatic chuck power supply 139b. In the embodiment described above, electrostatic chuck power supplies 139a and 139b output different DC voltages. However, in the present modification, each power supply is controlled by the control device 150 so as to output a waveform obtained by superimposing a triangular wave on each DC voltage.

The triangular wave superimposed on the waveforms 143a and 143b may be a linear triangular wave or a curved triangular wave, and a frequency and a duty ratio are determined in a manner the same as in the embodiment described above. On the other hand, the amplitude at which the current flowing from the wafer 126 is equal to that of the embodiment is smaller than that of the embodiment. This is because the dielectric film 130 between the electrostatic chuck electrodes 135a and 135b and the wafer 126 is smaller than the dielectric film 130 between the base material 129 and the wafer 126, so that a former has a bigger capacitance than a latter.

It is desirable that phases of the triangular waves superimposed on the waveforms 143a and 143b match. By matching the phases, a potential difference between the electrostatic chuck electrodes 135a and 135b is always constant, so that a chuck of the wafer 126 is not affected.

Fourth Modification

A fourth modification of the embodiment of the invention will be described with reference to FIGS. 15 and 16. FIG. 15 is a schematic diagram showing the cross section of the electrode 125 and details of the bias voltage generator 127 and the electrostatic chuck power supply 139 according to the present modification. In the present modification, the bias voltage generator 127 is connected to the base material 129, and the electrostatic chuck power supply 139 is connected to the electrostatic chuck electrodes 135a and 135b, respectively. The bias voltage generator 127 and the electrostatic chuck power supply 139 are controlled by the control device 150. The bias voltage generator 127 includes the automatic matching device 132, an amplifier 144, and an arbitrary waveform generator 145. The amplifier 144 is connected to the base material 129 via the automatic matching device 132. Further, the amplifier 144 amplifies a voltage input from the arbitrary waveform generator 145 with a certain gain and outputs the amplified voltage.

FIG. 16 is a diagram showing a voltage waveform 146 output from the amplifier 144. The waveform 146 is obtained by superimposing a radio frequency output from the radio frequency power supply 131 in the embodiment described above and a triangular wave output from the DC power supply 133 in the same embodiment. The arbitrary waveform generator 145 inputs a voltage obtained by dividing a voltage at each time point of the waveform 146 by a gain of the amplifier 144 to the amplifier 144 so that the amplifier 144 outputs the waveform 146. Further, when the amplifier 144 has frequency response, in order to make the amplifier 144 output the waveform 146, the arbitrary waveform generator 145 may input a waveform in which a specific frequency component is strengthened or weakened by calculating backward from the frequency response to the amplifier 144.

Fifth Modification

A fifth modification of the embodiment of the invention will be described with reference to FIGS. 17 and 18. FIG. 17 is a schematic diagram showing the cross section of the electrode 125 and details of an electrostatic chuck power supply 160 according to the present modification. In the present modification, the electrostatic chuck power supply 160 includes arbitrary waveform generators 147a and 147b, amplifiers 148a and 148b, and automatic matching devices 149a and 149b. The amplifier 148a is connected to the electrostatic chuck electrode 135a via the automatic matching device 149a, and the amplifier 148b is connected to the electrostatic chuck electrode 135b via the automatic matching device 149b, respectively. The amplifiers 148a and 148b amplify respective voltages input from the arbitrary waveform generators 147a and 147b with certain gains, and output the respective amplified voltages.

FIG. 18 is a diagram showing waveforms 161a and 161b which are output voltages of the amplifiers 148a and 148b. The waveforms 161a and 161b are obtained by further superimposing radio frequencies respectively on the output waveforms of the electrostatic chuck power supplies 139a and 139b in the third modification. A frequency of a radio frequency to be superimposed is equal to the radio frequency output from the radio frequency power supply 131 in the embodiment described above. On the other hand, the amplitude of the voltage is set by multiplying amplitude of the output voltage of the radio frequency power supply 131 in this embodiment by an attenuation rate when the radio frequency applied to the base material 129 in this embodiment is transmitted to the electrostatic chuck electrodes 135a and 135b, and thus the same effect as in the embodiment can be obtained for the wafer 126.

The arbitrary waveform generators 147a and 147b input voltages obtained by dividing voltages of the waveforms 161a and 161b at each time point by a gain of the amplifier 148a or 148b, to the amplifiers 148a and 148b, respectively. Further, when the amplifiers 148a and 148b have frequency response, in order to make the amplifiers 148a and 148b output the waveforms 161a and 161b, the arbitrary waveform generators 147a and 147b may input waveforms in which a specific frequency component is strengthened or weakened by calculating backward from the frequency response to the amplifiers 148a and 148b.

Although the invention made by the present inventor is described in detail based on the embodiments, the invention is not limited to the above embodiments, and various modifications are included. For example, the embodiments described above are described in detail for easy understanding of the invention, and the invention is not necessarily limited to those including all the configurations described above.

Further, a part of the configuration of one embodiment can be replaced with the configuration of another embodiment, and the configuration of one embodiment can also be added to the configuration of another embodiment. Further, a part of the configuration of each embodiment may be added to, deleted from, or replaced with another configuration. Each member or relative sizes described in the drawings are simplified and idealized for easy understanding of the invention, and may have more complicated shapes in terms of implementation.

Structures or methods described in the above embodiments are not limited to those in the above embodiments, and include various application examples.

REFERENCE SIGN LIST 100 plasma processing apparatus
104 vacuum processing chamber
125 electrode
126 wafer
127 bias voltage generator
129 base material
130 dielectric film
131 radio frequency power supply
132, 149a, 149b automatic matching device
133 DC power supply
134 low-pass filter
135a, 135b electrostatic chuck electrode
136 plasma
138a, 138b parallel circuit
139, 139a, 139b, 160 electrostatic chuck power supply
139a, 139b power supply unit
145, 147a, 147b arbitrary waveform generator
150 control device

The invention claimed is:

1. A plasma processing apparatus, comprising:
a processing chamber in which a sample is subjected to plasma processing;
a first radio frequency power supply that supplies radio frequency power for generating plasma;
a sample stage that includes a film that electrostatically attracts the sample, and on which the sample is mounted;
a second radio frequency power supply that supplies radio frequency power to the sample stage; and
a first DC power supply that applies a first DC voltage to an electrode arranged inside the film; and
a second DC power supply that applies a second DC voltage, that is changed according to a periodically repeated waveform, to the electrode,
wherein the waveform of one cycle has a period in which amplitude changes by a predetermined amount or more during a predetermined time.

2. The plasma processing apparatus according to claim 1, wherein
a change time and a change amount of the amplitude are a change time and a change amount of amplitude that maintains 10% or more of a maximum value of a current generated in the sample by the waveform for 1 ms or more.

3. The plasma processing apparatus according to claim 1, wherein
the waveform is a triangular wave.

4. The plasma processing apparatus according to claim 3, wherein
the waveform is a curved triangular wave.

5. The plasma processing apparatus according to claim 1, wherein
the radio frequency power to be supplied to the sample stage is supplied to the sample stage when the second DC voltage is applied to the electrode.

6. The plasma processing apparatus according to claim 1, wherein
a frequency of the waveform is 500 Hz or less.

7. The plasma processing apparatus according to claim 1, wherein
the waveform is a rectangular wave, and
rising and falling time constants of the rectangular wave are 0.43 ms or more, respectively.

8. A plasma processing apparatus, comprising:
a processing chamber in which a sample is subjected to plasma processing;
a first radio frequency power supply that supplies radio frequency power for generating plasma;
a sample stage on which the sample is mounted; and
a second radio frequency power supply that supplies radio frequency power to the sample stage, wherein
the plasma processing apparatus further comprises a DC power supply that applies a DC voltage, that is changed according to a periodically repeated waveform, to the sample stage,
the waveform of one cycle has a period in which amplitude changes by a predetermined amount or more during a predetermined time,
a ratio of a time during which the DC voltage rises to a time during which the DC voltage falls is a value obtained by dividing a predetermined value by a value obtained by subtracting the predetermined value from 1,
the predetermined value is a value obtained by dividing mobility of ions by a sum of mobility of electrons in a dielectric on the sample and the mobility of the ions in the dielectric, and
a start time of the DC voltage being applied occurs before a start time of the second radio frequency power being applied, and an end time of the DC voltage being applied occurs after an end time of the second radio frequency power being applied.

9. The plasma processing apparatus according to claim 8, wherein
a frequency of the waveform is 1000 times the smaller value of the value obtained by subtracting the predetermined value from 1 and the predetermined value where a unit of the frequency is Hz.

10. The plasma processing apparatus according to claim 8, wherein
the waveform is a triangular wave.

11. The plasma processing apparatus according to claim 10, wherein
the waveform is a curved triangular wave.

12. The plasma processing apparatus according to claim 8, wherein
the sample stage includes an electrode that electrostatically attracts the sample, and
the DC voltage is applied to the electrode.

13. The plasma processing apparatus according to claim 8, wherein
the radio frequency power to be supplied to the sample stage is supplied to the sample stage when the DC voltage is applied to the sample stage.

14. The plasma processing apparatus according to claim 8, wherein
a frequency of the waveform is 500 Hz or less.

15. The plasma processing apparatus according to claim 8, wherein
the waveform is a rectangular wave, and
rising and falling time constants of the rectangular wave are 0.43 ms or more, respectively.

16. The plasma processing apparatus according to claim 8, wherein
a start time of the DC voltage being applied occurs before a start time of the first radio frequency power being applied, and an end time of the DC voltage being applied occurs after an end time of the first radio frequency power being applied.

\* \* \* \* \*